(12) United States Patent
Xiang

(10) Patent No.: US 6,787,423 B1
(45) Date of Patent: Sep. 7, 2004

(54) STRAINED-SILICON SEMICONDUCTOR DEVICE

(75) Inventor: Qi Xiang, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/314,331

(22) Filed: Dec. 9, 2002

(51) Int. Cl.[7] .............................. H01L 21/336
(52) U.S. Cl. .................. 438/296; 438/294; 438/735; 438/739
(58) Field of Search ............... 438/172, 197, 438/221, 222, 225, 735, 737, 738, 739, 752, 218, 219, 294–296; 257/192, 289, 353

(56) References Cited

U.S. PATENT DOCUMENTS

| | | |
|---|---|---|
| 5,759,898 A | 6/1998 | Ek et al. |
| 6,039,803 A | 3/2000 | Fitzgerald et al. |
| 6,180,490 B1 | 1/2001 | Vassiliev et al. |
| 6,207,530 B1 | 3/2001 | Hsu et al. |
| 6,214,653 B1 | 4/2001 | Chen et al. |
| 6,251,751 B1 | 6/2001 | Chu et al. |
| 6,300,172 B1 | 10/2001 | Ang et al. |
| 6,313,486 B1 | 11/2001 | Kencke et al. |
| 6,339,244 B1 | 1/2002 | Krivokapic |
| 6,599,840 B2 * | 7/2003 | Wu et al. .................. 438/705 |
| 6,627,515 B1 * | 9/2003 | Tseng et al. ............... 438/439 |
| 6,682,965 B1 * | 1/2004 | Noguchi et al. ............ 438/199 |
| 6,690,043 B1 * | 2/2004 | Usuda et al. ............... 257/194 |
| 6,703,271 B2 * | 3/2004 | Yeo et al. .................. 438/221 |
| 6,730,576 B1 * | 5/2004 | Wang et al. ................ 438/413 |
| 2001/0003269 A1 | 6/2001 | Wu et al. |
| 2001/0008284 A1 | 7/2001 | Huang |
| 2001/0016383 A1 | 8/2001 | Chen et al. |
| 2001/0024884 A1 | 9/2001 | Fitzgerald |
| 2002/0052074 A1 * | 5/2002 | Houghton et al. .......... 438/204 |
| 2004/0097025 A1 * | 5/2004 | Fitzgerald et al. .......... 438/197 |

OTHER PUBLICATIONS

Journal of the Electrochemical Society, vol. 142, No. 3, Mar. 1995, pp. 1260–1266.

* cited by examiner

*Primary Examiner*—Tom Thomas
*Assistant Examiner*—N. Drew Richards

(57) ABSTRACT

High-speed semiconductor devices with reduced source/drain junction capacitance and reduced junction leakage based on strain silicon technology are fabricated by extending a shallow trench isolation region under the strained silicon layer. Embodiments include anisotropically etching the trench region and subsequently isotropically etching the trench to form laterally extending regions under the strained silicon layer. Embodiments also include filling the trench with an insulating material such that an air pocket is formed in the trench.

8 Claims, 7 Drawing Sheets

STRAINED-SILICON SEMICONDUCTOR DEVICE

FIELD OF THE INVENTION

The present invention relates to manufacturing of semiconductor devices, and more particularly, to forming devices based on strained-silicon with improved electrical characteristics.

BACKGROUND OF THE INVENTION

There is a continuing drive in the semiconductor industry to fabricate devices exhibiting increased performance and decreased power consumption. Planar transistors, such as metal oxide semiconductor field effect transistors (MOSFET) are particularly well suited for use in high-density integrated circuits. As the size of MOSFETs and other devices decrease, the dimensions of source/drain regions, channel regions, and gate electrodes also decrease.

Strained-silicon transistors are typically fabricated by depositing a layer of silicon germanium (SiGe) on a bulk silicon wafer. A thin layer of silicon is subsequently deposited on the SiGe layer. The distance between atoms in a SiGe crystal lattice is greater than the distance between atoms in an ordinary silicon crystal lattice. There is a natural tendency of atoms inside different types of crystals to align with one another where one crystal is formed on another crystal. As such, when a crystal lattice of silicon if formed on top of a layer of SiGe, the atoms in the silicon crystal lattice stretch or "strain" to align with atoms in the SiGe lattice. A resulting advantage of such feature is that the strained silicon experiences less resistance to electron flow and produces gains of up to 80% in speed as compared to ordinary crystalline silicon. However, strained-silicon technology has its disadvantages. The dielectric constant for SiGe is higher than silicon and results in higher junction capacitance. Second, the band-gap in SiGe is smaller than silicon and the smaller band-gap results in higher junction leakage. Accordingly, a need exists for an improved method of fabricating semiconductor devices based on a strained silicon structure that exhibit high-speed with lower junction capacitance and reduced junction leakage.

The miniaturization of planar transistors with short channel lengths requires very shallow source/drain junctions to avoid lateral diffusion of implanted dopants into the channel which causes leakage currents and poor breakdown performance. Shallow source/drain junctions, on the order of 1,000 Å or less, are generally required for acceptable performance in short channel devices.

Silicon on insulator (SOI) technology allows the formation of high-speed, shallow-junction devices. In addition, SOI devices improve performance by reducing parasitic junction capacitance. Although, SOI technology improves the performance of shallow-junction devices, devices that require deeper junctions do not benefit from SOI. For example, devices which are temperature sensitive or which require a deep implant perform better when formed in the bulk substrate.

Shallow trench isolation (STI) provides another technique to shrink device size. The use of STI significantly shrinks the area needed to isolate transistors better than local oxidation of silicon (LOCOS). STI also provides superior latch-up immunity, smaller channel width encroachment, and better planarity. The use of STI techniques eliminates the bird's-beak frequently encountered with LOCOS.

Semiconductor devices generally suffer from decreased threshold voltages ($V_t$) at the silicon active region/STI interface. This is known as the fringing field effect. In devices with strained silicon layers formed over SiGe layers, the decreased $V_t$ at the STI interface becomes more pronounced. The $V_t$ at the strained silicon layer/STI interface is about 100–200 mV lower than central portions of the strained silicon layer. The decreased V, at the edge of the strained silicon layer causes increased off-state leakage.

SUMMARY OF THE INVENTION

There exists a need for methodology enabling the fabrication of semiconductor devices that exhibit the combined performance improvements of SOI technology, STI technology, and strained silicon technology. There exists a particular need for methodology enabling the fabrication of semiconductor devices with reduced off-state leakage and increased threshold voltage at the STI edge.

The above needs are met by a method of manufacturing a semiconductor device, the method comprising providing a semiconductor substrate comprising a silicon germanium (SiGe) layer on the semiconductor substrate layer and a strained silicon layer formed on the SiGe layer. Trenches are formed that extend from an upper surface of the strained silicon layer into the SiGe layer is formed. The trenches are enlarged by forming laterally extending regions which undercut a portion of the strained silicon layer. The trenches are filled with an insulating material to form trench isolation regions and a transistor is subsequently formed. The transistor comprises source/drain regions that are substantially within the strained silicon layer and a portion of each source/drain region is located over one of the laterally extending regions. In certain embodiments, the transistor is formed before the trenches.

The above needs are also met by a semiconductor device comprising a semiconductor substrate comprising a silicon-containing substrate. A SiGe layer is formed on the silicon-containing substrate and a strained silicon layer is formed on the SiGe layer. Trench isolation regions extend through the strained silicon layer into the SiGe layer and a portion of the trench isolation region extends laterally in the SiGe layer under the strained silicon layer. A transistor comprising source/drain regions which are located substantially within the strained silicon layer is formed and a portion of each source/drain region is located over the laterally extending portion of the trench isolation regions.

The above needs are further met by certain embodiments of the instant invention that provide a semiconductor device comprising a silicon-containing semiconductor substrate and a SiGe layer formed on the semiconductor substrate. A strained silicon layer is formed on the SiGe layer. A trench isolation region extends through the strained silicon layer into the SiGe layer, wherein a portion of the trench isolation region extends laterally into the SiGe layer undercutting the strained silicon layer.

The present invention addresses the needs for an improved high-speed semiconductor device with improved electrical characteristics and reduced off-state leakage.

The foregoing and other features, aspects, and advantages of the present invention will become apparent in the following detailed description of the present invention when taken in conjunction with the accompanying drawings.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, in which like reference numerals are employed throughout to designate similar features, wherein.

DETAILED DESCRIPTION OF THE INVENTION

Figure 1:
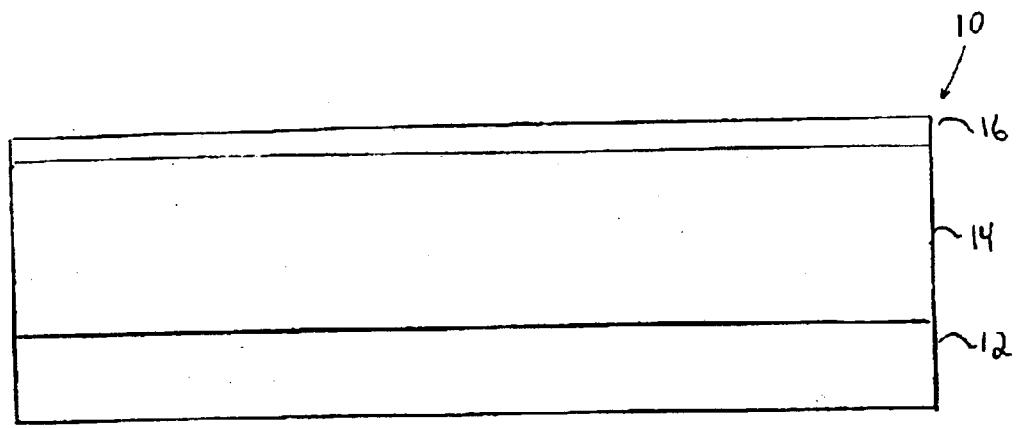
FIGS. 1–14 schematically illustrate the formation of a SOI silicon semiconductor device comprising a strained silicon layer according to one embodiment of the instant invention.

The present invention enables the production of improved high-speed semiconductor devices with reduced source/drain junction capacitance and reduced junction leakage. The present invention further provides the higher speed offered by strained silicon technology coupled with the smaller overall device size provided by STI technology. These benefits are provided by combining SOI. STI, and strained silicon technology on a single substrate. Since the dielectric constant of SiGe is higher than Si, certain embodiments of the present invention substantially confines the source/drain regions in the strained Si layer to effectively minimize junction capacitance. Furthermore, the band-gap of Si-Ge is smaller than Si, and this smaller band-gap results in junction leakage. Certain embodiments of the present invention minimizes junction leakage by confining the source/drain regions substantially in the strained Si layer.

Other certain embodiments minimize junction leakage due to the fringing field effect and the strained silicon layer over the SiGe layer. The $V_t$ at the STI/strained silicon interface is increased by undercutting the edge of the strained silicon layer and extending the STI layer under the strained silicon layer.

The embodiments of the present invention will be described in conjunction with the formation of the semiconductor device illustrated in the accompanying drawings. However, this is exemplary only as the claimed invention is not limited to the formation of the specific device illustrated in the drawings.

Semiconductor substrate 10 is provided, as shown in FIG. 1. Semiconductor substrate 10 comprises a substrate layer 12, such as a silicon-containing wafer, with a SiGe layer 14 formed thereon. A layer of strained silicon 16 is formed over the SiGe layer 14. The substrate layer 12 is typically a silicon wafer about 100 µm thick. The SiGe layer 14 is typically formed by a chemical vapor deposition (CVD) process, such as ultra-high vacuum chemical vapor deposition (UHVCVD). The concentration of Ge in the SiGe layer 14 is from about 15 atomic (at.) % Ge up to a maximum concentration of about 30 at. % Ge. In certain embodiments, the concentration of Ge is graded from about 0 at. % Ge at the SiGe layer 14/substrate layer 12 interface increasing as the SiGe layer 14 is deposited up to a maximum concentration of about 30 at. % Ge.

The strained silicon layer 16 is typically an epitaxial layer formed by CVD to a thickness of about 100 Å to about 300 Å. The thickness of the strained silicon layer depends on the Ge concentration in the SiGe layer. The critical thickness of a strained silicon layer is the maximum thickness below which the strained silicon is defect free. When the Ge concentration in the SiGe layer 14 is about 15 wt. %, the critical thickness of the strained silicon layer 16 is about 300 Å. When the Ge concentration in the SiGe layer 14 is about 20 wt. %, the critical thickness of the strained silicon layer 16 is about 200 Å. When the Ge concentration in the SiGe layer 14 is about 30 at. %, the critical thickness of the strained silicon layer 16 is about 100 Å. The atoms in the strained silicon layer 16 stretch apart from each other in order to align themselves with the underlying lattice structure of the SiGe layer. Electron flow in this "strained silicon" layer 16 is much faster than in ordinary crystalline silicon.

Figure 2:
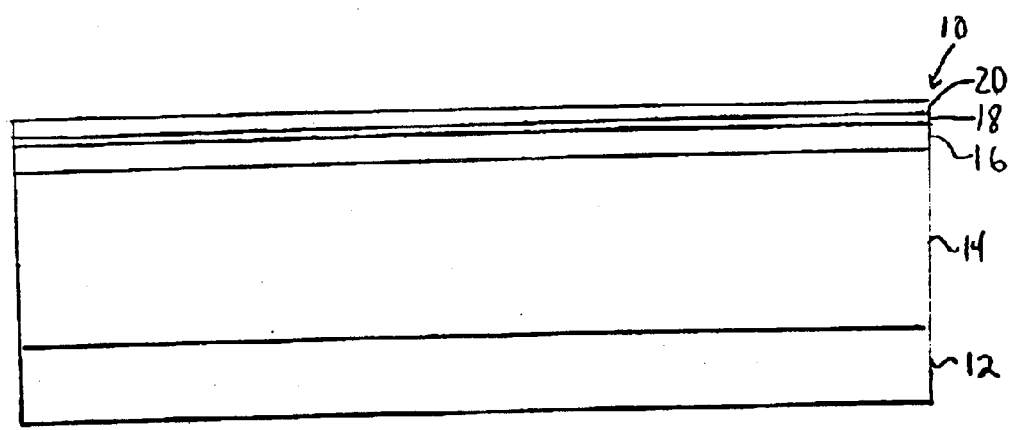

A silicon oxide layer 18 and silicon nitride layer 20 are subsequently formed over the strained silicon layer 16, as shown in FIG. 2. The silicon oxide layer 18 is about 100 Å to about 200 Å thick and the silicon nitride layer 20 is about 1000 Å to about 2000 Å thick. The oxide 18 and nitride 20 layers can be formed by conventional means, such as by CVD.

Figure 3:
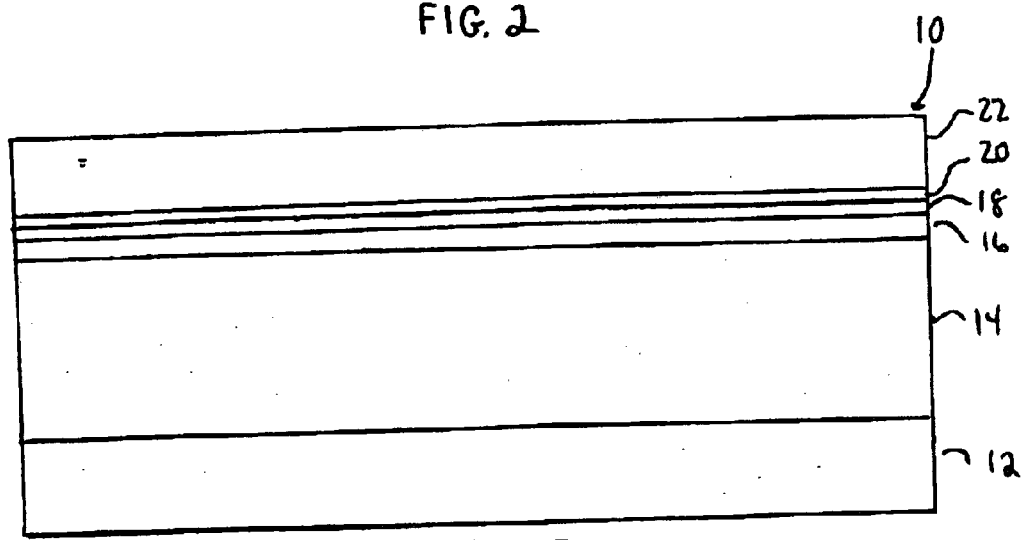
Figure 4:
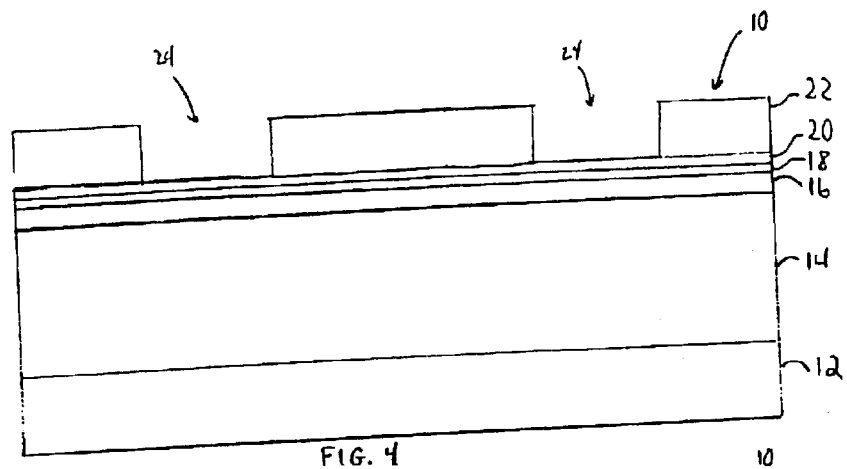
Figure 5:
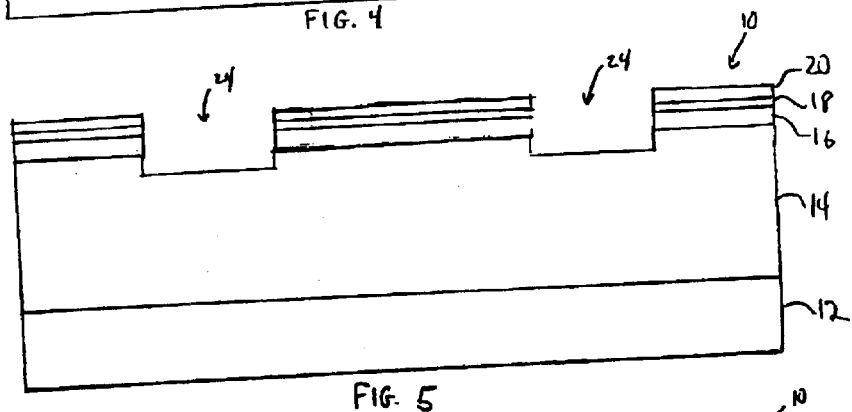

A resist layer 22 comprising a conventional photoresist is formed over substrate 10, as shown in FIG. 3. The resist layer 22 is subsequently patterned using conventional photolithographic and etching techniques to form a trench 24 in the semiconductor substrate 10, as shown in FIG. 4. The trench regions 24 are extended through the silicon nitride layer 20, silicon oxide layer 18, strained silicon layer 16, and into the SiGe layer 14 by anisotropic etching, and the photoresist layer 22 is then stripped, as shown in FIG. 5. Anisotropic etching is performed using conventional techniques, such as plasma etching or reactive ion etching. Anisotropic etching can be carried out in a series of plasma etching steps using different known plasmas that optimally etch the various different layers.

Figure 6:
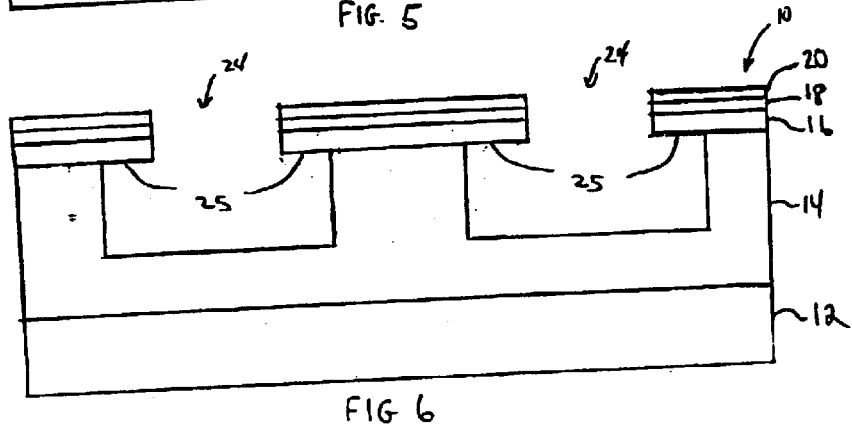

In FIG. 6, the trench regions 24 are subsequently enlarged, undercutting the strained silicon layer 16 by isotropic etching to form laterally extending regions. In certain embodiments of the instant invention, an isotropic wet etchant, such as a mixture of hydrofluoric acid (HF), hydrogen peroxide ($H_2O_2$), and acetic acid ($CH_3COOH$), that selectively etches SiGe is used to form the laterally extending regions 25 which undercut a portion of the strained silicon layer 16. For example, a 1:2:3 by volume solution of $HF/H_2O_2/CH_3COOH$ is an effective etchant in certain embodiments of the instant invention. The $HF/H_2O_2/CH_3COOH$ etchant is highly-selective and can etch SiGe up to 300 times faster than silicon. Isotropic etching is continued to enlarge the trench regions 24 to a maximum depth of about 1000 Å to about 6000 Å and a maximum width of about 1000 Å to about 6000 Å.

In certain embodiments of the instant invention, the strained silicon layer is undercut to the extent that the subsequently formed source/drain regions are substantially formed in the undercut region of the strained silicon layer. In other embodiments, only the edge areas of the silicon layer along the STI regions are undercut.

Figure 7:
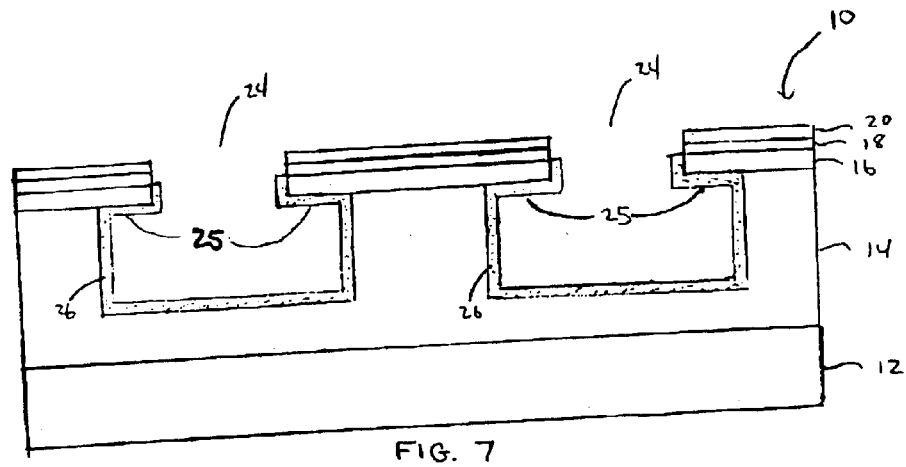

After enlarging the trench regions 24, oxide liners 26 are formed, as shown in FIG. 7. Oxide liners 26 are a thermal oxide liner grown to a thickness of about 30 Å to about 100 Å. The thermal oxide liner layers 26 are grown by conventional methods, such as by exposing the semiconductor substrate 10 to an oxygen ambient at a temperature of approximately 950° C. to about 1100° C.

Figure 8:
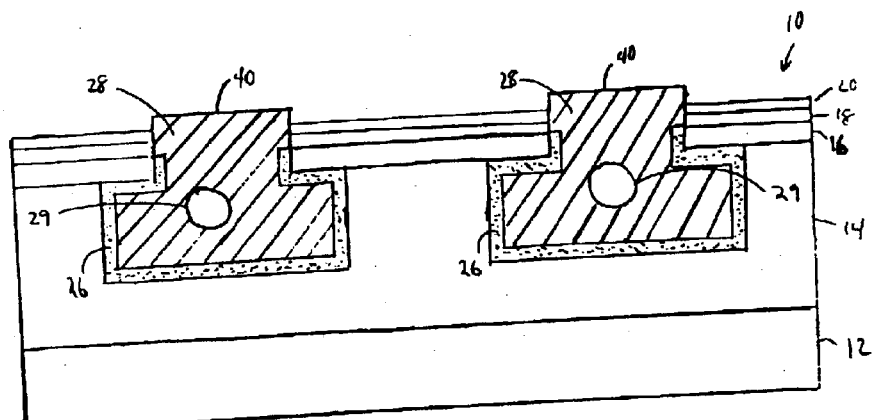

The trench regions 24 are subsequently filled with a suitable insulating material 28 as by a conventional CVD process, as shown in FIG. 8. Suitable insulating materials 28 include silicon nitride and silicon oxide. Typically, trench regions 24 are filled with silicon oxide 28 to form isolation regions 40. This process of forming isolation regions 40 is known as shallow trench isolation (STI). Some of the conventional methods of filling trench regions 24 include: a) tetraethylorthosilicate low pressure chemical vapor deposition (TEOS LPCVD), b) non-surface sensitive TEOS ozone atmospheric or sub-atmospheric pressure chemical vapor deposition (APCVD or SACVD), and c) silane oxidation high-density plasma CVD.

Because of the relatively narrow opening in the trench regions 24 and the laterally extending regions 25, an air pocket 29, as shown in FIG. 8 only, may develop when the trench 24 is filled with an insulating material 28 such as silicon oxide. The trenches are filled with the insulating material such that an air pocket 29 is formed under a source/drain region.

Figure 9:
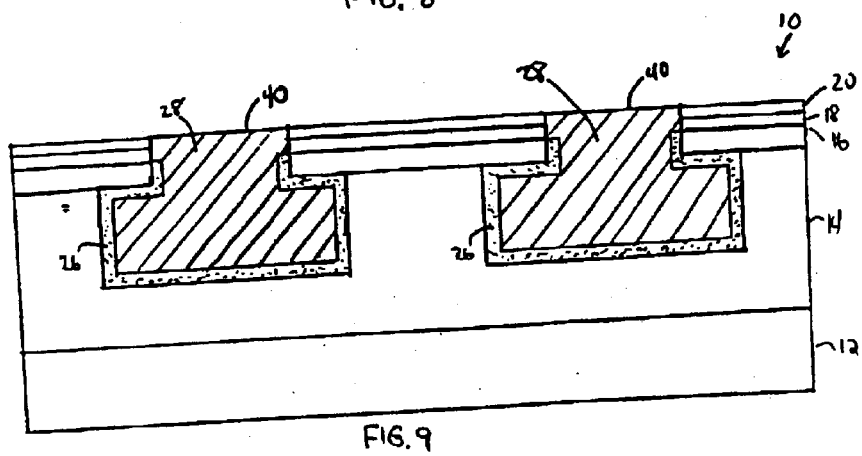
Figure 10:
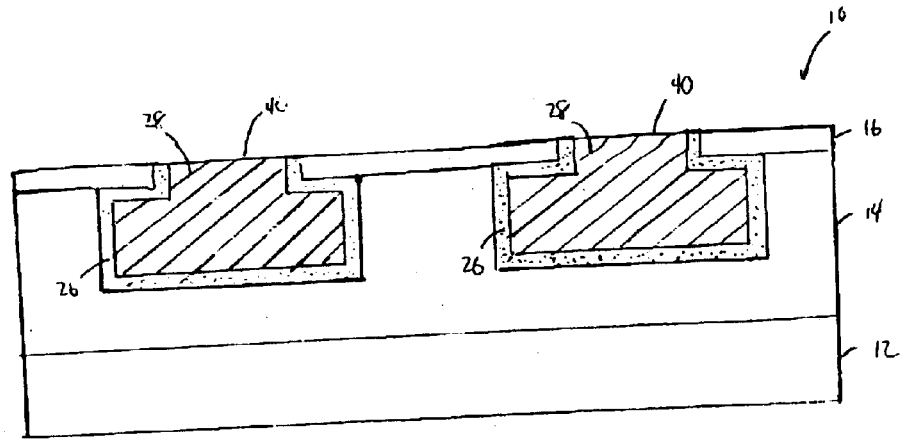

Semiconductor substrate 10 is planarized by chemical method mechanical polishing (CMP), as shown in FIG. 9. After planarizing, nitride layer 20 and oxide layer 18 are subsequently removed, as shown in FIG. 10. Nitride layer 20 and oxide layer 18 are typically removed by wet etching. Hot phosphoric acid is conventionally used to etch silicon nitride and hydrofluoric acid or a mixture of hydrofluoric acid and ammonium fluoride (buffered oxide etch) is used to remove the oxide layer.

Figure 11:
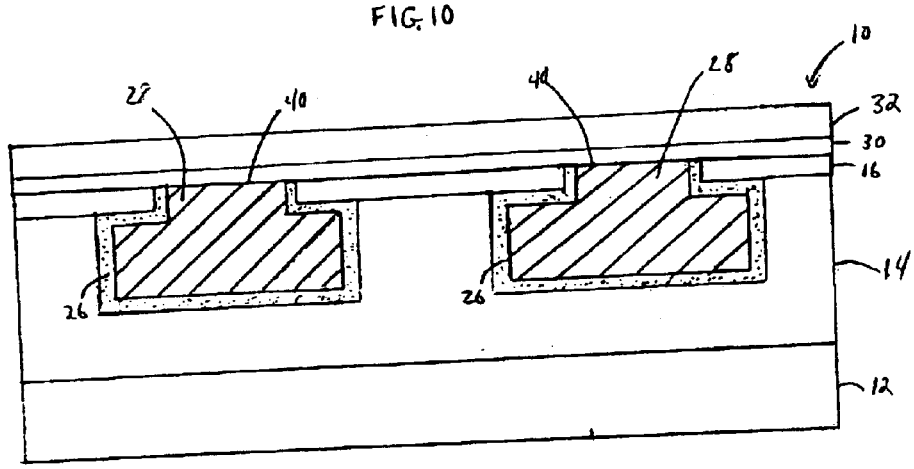

After isolation regions 40 are formed, a transistor 42 is formed. Gate oxide layer 30 and gate electrode 32 are formed over conductive substrate 10, as shown in FIG. 11. Gate oxide layer 30 is formed to a thickness of about 10 Å to about 100 Å by either CVD or by thermal oxidation of a portion of the strained silicon layer 16. The gate electrode layer 32 is formed by depositing polysilicon to a thickness of about 100 nm to about 300 nm.

Figure 12:
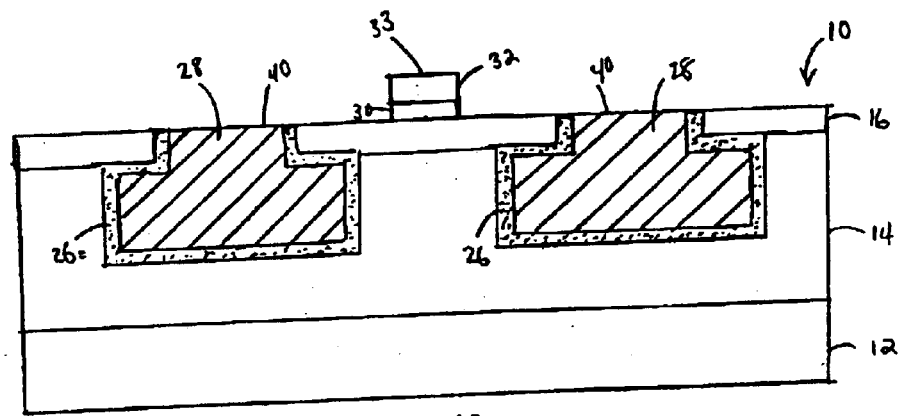
Figure 13:
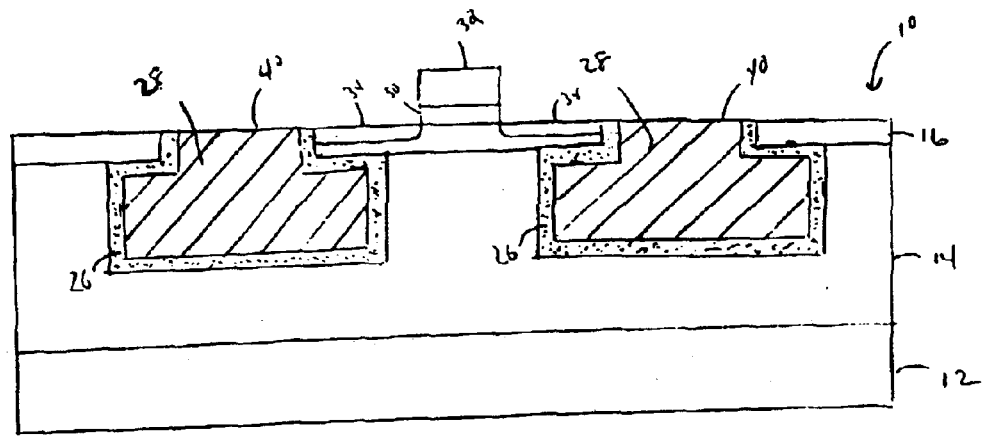
Figure 14:
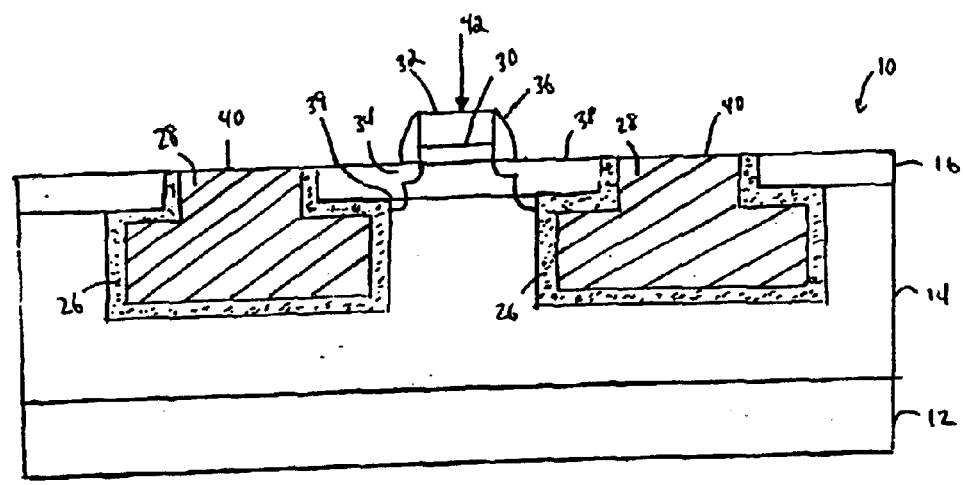

The structure is subsequently masked and the gate oxide layer 30 and gate electrode layer 32 are patterned to form gate electrode structures 33, as shown in FIG. 12. Source/drain extensions 34 are formed by ion implantation, as shown in FIG. 13. Sidewall spacers 36 are subsequently formed on the gate electrode structures 33 by depositing a layer of insulating material, such as silicon nitride or silicon oxide followed by anisotropic etching to form the sidewalls 36, as shown in FIG. 14. Source/drain regions 38 are subsequently formed by conventional techniques such as ion implantation, and then annealed to form the source/drain regions 38 with lightly doped drain extensions 34 and heavily doped regions 39, as shown in FIG. 14.

In the above-described semiconductor device, the transistor 42 is formed after the formation of the isolation regions 40. However, the transistor 42 may be formed prior to the formation of the isolation regions 40 in a similar manner as described.

Figure 15:
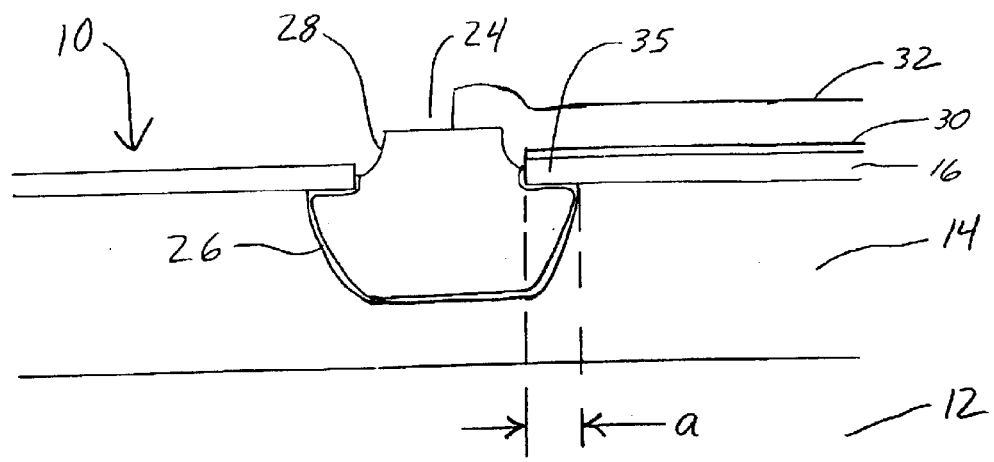
FIG. 15 schematically illustrates a strained silicon semiconductor device wherein the STI region extends into the SiGe layer under the silicon layer.

In certain other embodiments of the instant invention, the undercut of the silicon layer 16 and subsequent extension of the STI 28 is limited to the edge portion of the silicon layer 16, as shown in FIG. 15. FIG. 15 depicts a section taken along the length of the gate the center of the gate electrode structure 33. The length of the undercut "a" is from about 100 Å to about 1000 Å. Upon filling the trench 24 with insulating material 28 a SOI region 35 is formed around the edge of the silicon layer 16. The formation of SOI region 35 increases the threshold voltage $V_t$ of the edge region 35 from about 100 to 200 mV, which effectively counteracts the drop in threshold voltage experienced in the edge region of the silicon layer 14 suffered by conventional strained silicon layers formed over SiGe layers.

Undercutting the edge region 35 of the silicon layer is particularly well-suited for strained silicon semiconductor devices with thicker strained silicon layers, i.e.—about 200 Å to 300 Å thick. Thinner silicon layers would tend to become fully depleted at the edge region 35. Fully depleted silicon layers suffer from further decreased $V_t$. Therefore thicker, silicon layers 14 are desired to prevent the SOI region 35 from becoming fully depleted.

Because the thickness of the strained silicon layer 14 is inversely dependent on the Ge concentration in the SiGe layer 14, SiGe layers 14 with lower concentration Ge are desirable in the embodiment where only the edge region 35 of the silicon layer 14 is undercut. The edge undercut embodiment is better suited for devices with a Ge concentration in the SiGe layer of about 15 to about 20 at. %.

Figure 16:
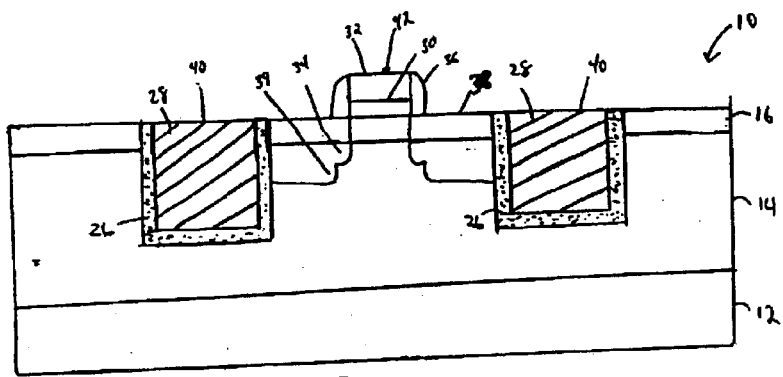
FIGS. 16–17 illustrate a conventional silicon semiconductor device comprising strained silicon technology.
Figure 17:
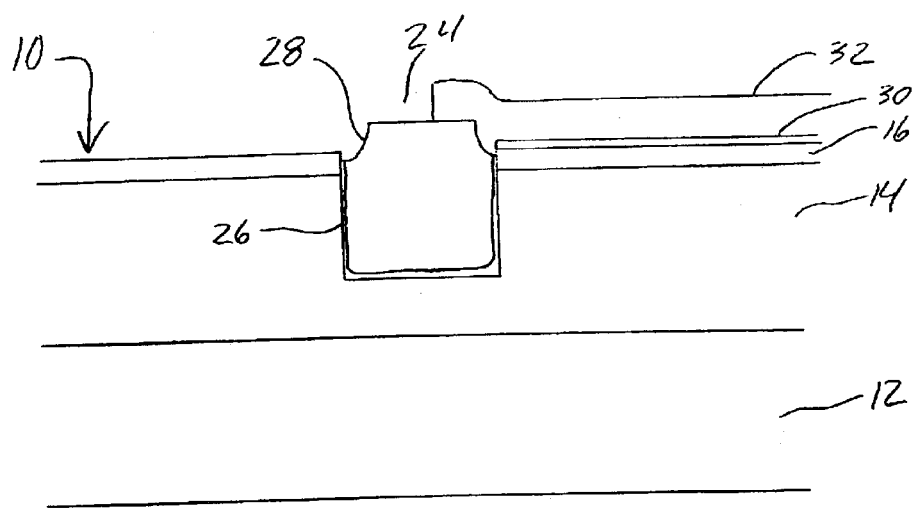

FIG. 16 depicts a conventional silicon semiconductor device comprising strained silicon technology. FIG. 17 represents the same semiconductor device as FIG. 16, but FIG. 17 depicts a section taken along the length of the gate the center of the gate electrode structure 33. The reference numerals in FIGS. 16 and 17 are identical to those in FIGS. 14 and 15 and therefore are not repeated here. As stated above, conventional strained silicon technology is prone to higher junction capacitance and junction leakage.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

The embodiments-illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A method of manufacturing a semiconductor device, the method comprising:
   providing a semiconductor substrate comprising a silicon germanium (SiGe) layer formed on a substrate layer and a strained silicon layer formed on the SiGe layer;
   forming a trench extending from an upper surface of the strained silicon layer into the SiGe layer,
   enlarging the trench by forming a laterally extending region which undercuts a portion of the strained silicon layer;
   filling the trench with an insulating material to form a trench isolation region; and
   forming a transistor comprising source/drain regions substantially within the strained silicon layer such that a portion of each source/drain region is located over the laterally extending regions.

2. The method in accordance with claim 1, comprising:
   anisotropically etching to form the trench; and subsequently isotropically etching to form the laterally extending region.

3. The method in accordance with claim 1, comprising forming the transistor before forming the trench.

4. The method in accordance with claim 1, comprising forming and enlarging the trench before forming the transistor.

5. The method in accordance with claim 1, wherein the SiGe layer comprises about 15 to about 30 at. % Ge.

6. The method in accordance with claim 1, comprising filling the trench with the insulating material such that an air pocket is formed in the trench.

7. The method according to claim 6, comprising filling the trench with insulating material such that an air pocket is formed under a source/drain region.

8. The method in accordance with claim 1, wherein the substrate layer contains silicon.

* * * * *